US012772836B2

(12) United States Patent
Noguchi

(10) Patent No.: US 12,772,836 B2
(45) Date of Patent: Oct. 20, 2026

(54) SEMICONDUCTOR DEVICE AND METHOD OF MANUFACTURING THE SAME

(71) Applicant: Kioxia Corporation, Tokyo (JP)

(72) Inventor: Hiroshi Noguchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 357 days.

(21) Appl. No.: 18/532,144

(22) Filed: Dec. 7, 2023

(65) Prior Publication Data

US 2024/0203884 A1 Jun. 20, 2024

(30) Foreign Application Priority Data

Dec. 16, 2022 (JP) ................................ 2022-201088

(51) Int. Cl.

*H10W 20/47* (2026.01)
*H10W 20/00* (2026.01)
*H10W 20/41* (2026.01)

(52) U.S. Cl.

CPC ......... *H10W 20/47* (2026.01); *H10W 20/089* (2026.01); *H10W 20/435* (2026.01)

(58) Field of Classification Search

CPC . H10W 20/089; H10W 20/435; H10W 20/47; H10W 20/48

See application file for complete search history.

(56) References Cited

U.S. PATENT DOCUMENTS 6,242,339 B1 6/2001 Aoi
6,297,162 B1 * 10/2001 Jang .................... H10P 14/6336 257/E21.507
6,340,632 B1 1/2002 Fukada et al.
6,730,594 B2 5/2004 Noguchi et al.
7,323,781 B2 1/2008 Noguchi et al.
7,750,413 B2 7/2010 Hayashi et al.
7,838,382 B2 11/2010 Totsuka
7,999,391 B2 8/2011 Ootake et al.
9,711,530 B1 * 7/2017 Ikawa .................... H10B 43/27

(Continued)

FOREIGN PATENT DOCUMENTS

CN 101640176 A 2/2010
JP S60011880 A 1/1985

(Continued)

OTHER PUBLICATIONS

Shi et al. (Year: 2019).*

*Primary Examiner* — Shaun M Campbell
(74) *Attorney, Agent, or Firm* — Maier & Maier, PLLC

(57) ABSTRACT

A semiconductor device according to an embodiment comprises: a first insulating film; a second insulating film provided on the first insulating film; a third insulating film provided on the second insulating film; a first wiring provided in a first groove provided in the first insulating film; and a second wiring provided in a second groove provided in communication with the first insulating film, the second insulating film, and the third insulating film and connected to the first wiring, wherein the second insulating film contains silicon oxynitride, the second insulating film has a processing selectivity higher than processing selectivity of the first insulating film and the third insulating film, and the second insulating film has a dielectric strength voltage higher than a dielectric strength of silicon nitride.

16 Claims, 10 Drawing Sheets

(56) References Cited

U.S. PATENT DOCUMENTS

| | | | | |
|---|---|---|---|---|
| 2002/0140056 | A1* | 10/2002 | Yin | H10P 50/73 257/629 |
| 2004/0227242 | A1* | 11/2004 | Noguchi | H10W 20/087 257/E21.582 |
| 2007/0154674 | A1* | 7/2007 | Busman | G11B 7/2467 428/64.4 |
| 2010/0029091 | A1 | 2/2010 | Jeong et al. | |
| 2010/0219533 | A1* | 9/2010 | Ootake | H10W 20/033 257/773 |
| 2011/0260271 | A1* | 10/2011 | Fukui | H10B 61/22 257/E29.323 |
| 2015/0235943 | A1* | 8/2015 | Suzumura | H10W 20/01 257/774 |
| 2020/0243266 | A1* | 7/2020 | Totsuka | H01G 4/1272 |
| 2023/0275024 | A1* | 8/2023 | Chin | H10P 50/71 |

FOREIGN PATENT DOCUMENTS

| | | | |
|---|---|---|---|
| JP | 11-243147 | A | 9/1999 |
| JP | 2003-142579 | A | 5/2003 |
| JP | 2004-296515 | A | 10/2004 |
| JP | 2005-317835 | A | 11/2005 |
| JP | 2006-135362 | A | 5/2006 |
| JP | 2006-165597 | A | 6/2006 |
| JP | 2008235479 | A | 10/2008 |
| JP | 2010129690 | A | 6/2010 |
| JP | 4904813 | B2 | 1/2012 |
| TW | 201122146 | A | 7/2011 |
| WO | 2007-091574 | A1 | 5/2006 |

* cited by examiner

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2022-201088, filed on Dec. 16, 2022, the entire contents of which are incorporated herein by reference.

The present embodiment relates to a semiconductor device and a method of manufacturing the semiconductor device.

BACKGROUND

In recent years, it is required to downsize elements in semiconductor devices and downsize/multilayer wirings since the elements must be integrated. A multilayer wiring structure of such LSI devices may include a groove wiring called a damascene structure. Also, the distance between wirings is short in the multilayer wiring structure of such LSI devices, and plasma nitride films used as stopper films in conventional damascene structures sometimes lack dielectric strength voltage between the wirings.

DETAILED DESCRIPTION

An embodiment aims to provide a semiconductor device and a method of manufacturing the same that is capable of enhancing a controllability of processing the wiring and enhancing a dielectric strength between the wiring.

The semiconductor device according to one embodiment includes: a first insulating film; a second insulating film provided on the first insulating film; a third insulating film provided on the second insulating film; a first wiring provided in a first groove provided in the first insulating film; and a second wiring provided in a second groove provided in communication with the first insulating film, the second insulating film, and the third insulating film and connected to the first wiring, wherein the second insulating film contains silicon oxynitride, the second insulating film has a processing selectivity higher than processing selectivity of the first insulating film and the third insulating film, and the second insulating film has a dielectric strength higher than a dielectric strength voltage of silicon nitride.

Referring to the attached drawings, the semiconductor device according to the embodiments and the method of manufacturing the same will be described below. It is to be understood that the present invention is not limited to these embodiments.

First Embodiment

Figure 1:
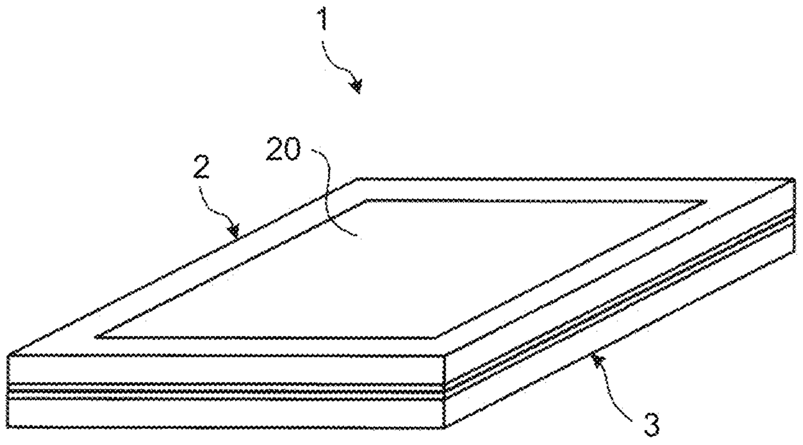
FIG. 1 is a perspective view illustrating a semiconductor device according to a first embodiment.
Figure 2:
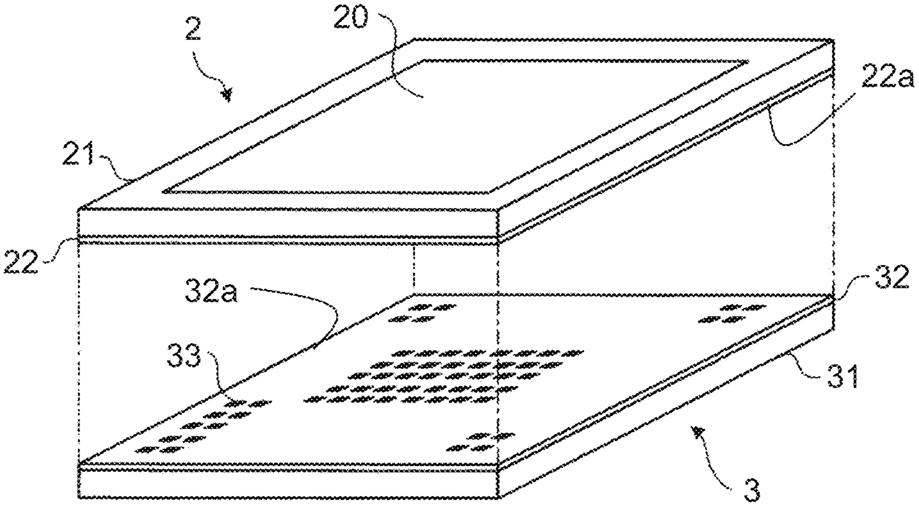
FIG. 2 is an exploded perspective view illustrating the semiconductor device according to the first embodiment.
Figure 3A:
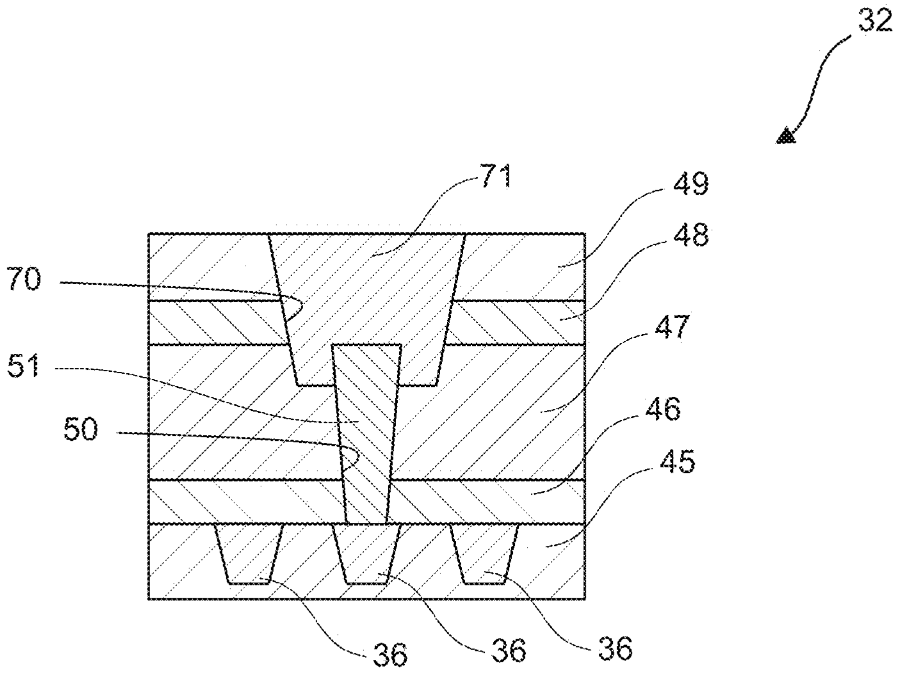
FIGS. 3A and 3B are explanatory diagrams illustrating a portion of a cross-sectional structure of the semiconductor device according to the first embodiment.
Figure 3B:
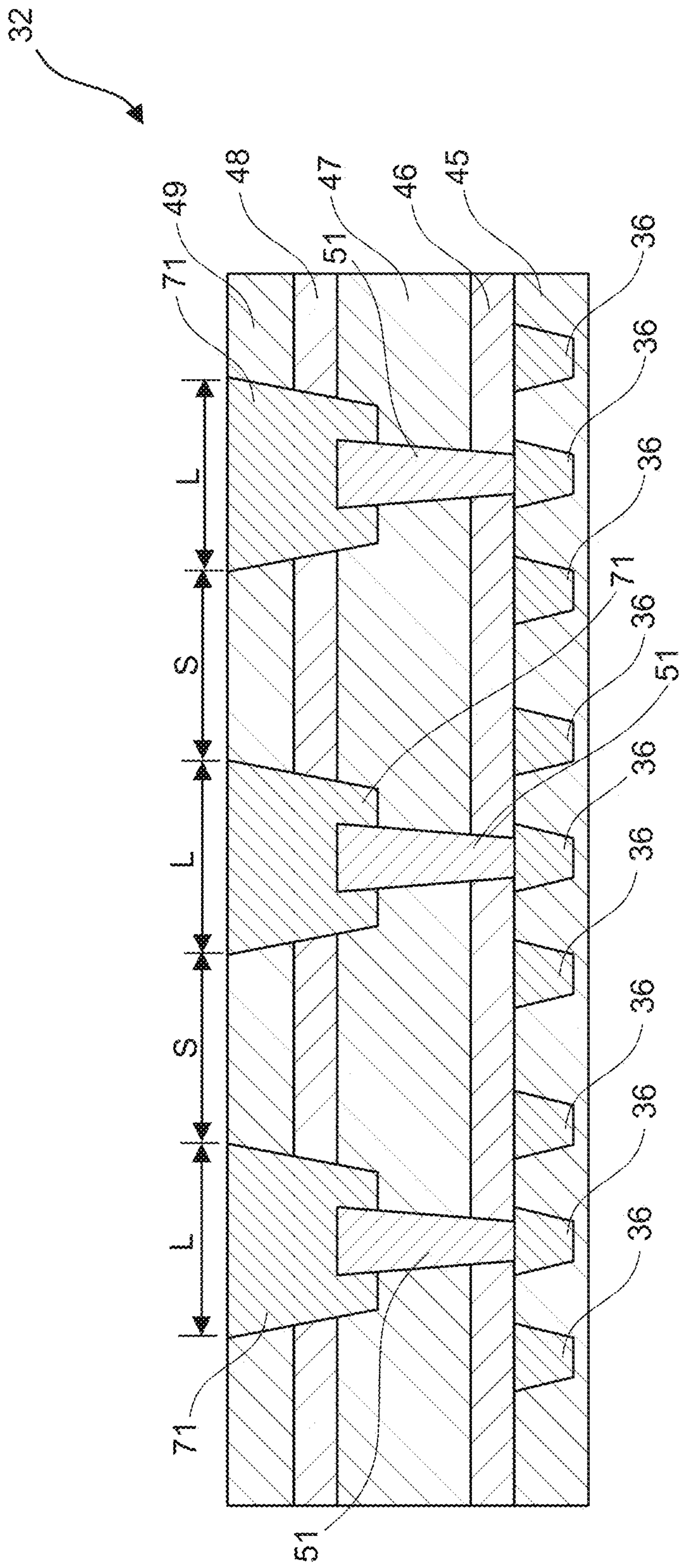

FIG. 1 is a perspective view illustrating a semiconductor device according to a first embodiment, and FIG. 2 is an exploded perspective view illustrating the semiconductor device according to the first embodiment. Also, FIGS. 3A and 3B are explanatory diagrams illustrating the portion of a cross-sectional structure of the semiconductor device according to the first embodiment. Although the structures of the semiconductor device according to the first embodiment show an example (structure having sensors), it is to be understood that the semiconductor device is not limited to such structure and may include other devices as well.

[Semiconductor Device]

For example, as shown in FIG. 1, the semiconductor device 1 may include a first substrate 3 and a second substrate 2 that are bonded together.

The first substrate 3 may be e.g., a logic substrate that includes logic circuits that read image signals of captured images from a Complementary Metal Oxide Semiconductor (CMOS) image sensor 20 and perform various signal processing on the read image signals.

Also, the second substrate 2 may be e.g., a sensor substrate including the CMOS image sensor 20 for imaging an object. The semiconductor device 1 may have a configuration in which a first logic substrate and a second logic substrate are bonded together or may have a configuration in which a logic substrate and a memory substrate are bonded together. Also, the semiconductor device 1 may have a configuration in which three or more substrates are bonded together.

As shown in FIG. 2, the first substrate 3 includes a device layer 31 on which a logic circuit or the like is provided, and a first connection wiring layer 32 provided on the upper surface of the device layer 31 and including a plurality of metal electrodes (simply referred as a “first electrode 33”). The first electrode 33 may be embedded in the first connection wiring layer 32 with one end face exposed from the first connection wiring layer 32 and connected to the logic circuit or the like via e.g., wiring inside the device layer 31.

On the other hand, as shown in FIG. 2, the second substrate 2 includes a device layer 21 on which the CMOS image sensor 20 or the like are provided, and a second connection wiring layer 22 provided on the lower surface of the device layer 21 and including a plurality of metal electrodes (simply referred as “electrodes” below) embedded in positions corresponding to the first electrodes 33 of the first substrate 3. The metal electrodes may be embedded in the second connection wiring layer 22 with one end face exposed from the second connection wiring layer 22 and connected to the CMOS image sensor 20 or the like via e.g., wiring inside the device layer 21.

The bonding surfaces of the second substrate 2 and the first substrate 3 are polished and flattened, and then directly bonded without using an adhesive after being subjected to activation treatment. As a result, the second substrate 2 and the first substrate 3 are temporarily bonded by hydrogen bonding due to an intermolecular force between the first connection wiring layer 32 and the second connection wiring layer 22. After that, the second substrate 2 and the first substrate 3 are subjected to heat treatment under predetermined conditions. Thereby, the second substrate 2 and the first substrate 3 are permanently bonded by covalent bonding between the first connection wiring layer 32 and the second connection wiring layer 22.

Thus, the metal electrode provided on the lower surface of the CMOS image sensor 20 provided on the second substrate 2 and the first electrode 33 provided on the upper surface of the first substrate 3 may be connected in the semiconductor device 1. Therefore, for example, according to the logic circuit provided in the first substrate 3, it becomes possible to reduce the area occupied by the substrate since the signals may be read from directly below the CMOS image sensor 20.

Next, a portion of a cross-sectional structure of the semiconductor device 1 according to the first embodiments will be described with reference to FIG. 3A. Although FIG. 3A selectively illustrates an area near the cross-section of the multilayer wiring structure including a damascene wiring structure of the first connection wiring layer 32 of the first substrate 3 e.g., shown in FIG. 2, the structure shown in FIG. 3A may also be applied on the multilayer wiring structure of the second connection wiring layer 22 of the second substrate or on other multilayer wiring structures.

For example, as shown in FIG. 3A, the first connection wiring 32 of the first substrate 3 (FIG. 2) may include an insulating layer 45, a wiring 36, a first insulating film 47, a second insulating film 48, a third insulating film 49, a first wiring 51, and a second wiring 71.

The insulating layer 45 is provided on the device layer 31 shown in FIG. 2. The insulating layer 45 may be e.g., a silicon oxide layer ($SiO_2$) or a layer other than silicon oxide.

The wiring 36 is provided inside the insulating layer 45. The wiring layer 36 is connected to the device such as the logic circuit provided inside the device layer 31 (refer to FIG. 2).

The insulating film 46 is formed on the insulating layer 45 where the wiring 36 is embedded using e.g., Chemical Vapor Deposition (CVD). The insulating film 46 may be a silicon carbonitride (SiCN) film. The insulating film 46 is made to function as a so-called cap film for wiring but may also function as a cap film other than silicon carbonitride.

The first insulating film 47 is formed on the insulating film 46 (the cap film) using e.g., CVD. The first insulating film 47 includes silicon oxide, which, specifically may have the formula $SiO_2$.

The second insulating film 48 is formed on the first insulating film 47. The second insulating film 48 made to function as a so-called stopper film for etching. The second insulating film 47 includes silicon oxynitride. Specifically, the second insulating film 48, for example, is a $SiO_xN_{1-x}$ film which may be formed using e.g., Plasma-Enhanced Chemical Vapor Deposition (PECVD). In particular, the value x of the $SiO_xN_{1-x}$ film that forms the second insulating layer 48 is preferably set between 0.2 and 0.41.

The third insulating film 49 is provided on the second insulating film 48. The third insulating film 49 includes silicon oxide, and specifically, may be the $SiO_2$ film.

As described, the second insulating film 48 may be the silicon oxynitride film ($SiO_xN_{1-x}$ film) formed using e.g., plasma CVD. In particular, the value of x in the $SiO_xN_{1-x}$ film that forms the second insulating film 48 is set between 0.2 and 0.41. By such, as will be described below, the second insulating film 48 has properties to function as the etching stopper film, where a processing selectivity is higher than that of the first insulating film (silicon oxide film) 47 and the third insulating film (silicon oxide film) 49 and where the dielectric strength voltage is higher than that of silicon nitride.

The first wiring 51, for instance, as shown in FIG. 3A, is provided in a first groove 50 provided in communication with the insulating film 46 and the first insulating film 47. In the example of FIG. 3, the upper part of the first wiring 51 protrudes out from the first groove 50.

The first wiring 51 may have a conductive film including e.g., tungsten provided inside the first groove 50, but may also have the conductive film including other metals such as Cu or Al. The first wiring 50 includes a barrier metal film (not illustrated) provided between the conductive film and the first groove 50.

The second wiring 71, for example, as shown in FIG. 3, is provided on a second groove 70 provided in communication with the first insulating film 47, the second insulating film 48, and the third insulating film 49. For instance, as shown in FIG. 3, in the first insulating film 47, the second groove 70 is formed on and communicates with the first groove 50. In the second groove 70, the second wiring 71 are connected with the upper portion of the first wiring 51.

The second wiring 71 may include a conductive layer including e.g., tungsten provided inside the second groove 70, but may also have the conductive film including other metals such as Cu or Al. The second wiring 70 includes the barrier metal film (not illustrated) provided between the conductive film and the second groove 70.

In particular, in the multilayer wiring structures shown in FIG. 3B illustrating an exemplary structure where a plurality of second wirings 71 is adjacently disposed, a distance S between a line width L of the second wiring 71 and an adjacent second wiring 71 may be set to e.g., in a range of 10 nm or more and 50 nm or less. For example, during operation of the semiconductor device 1, it is envisaged that a voltage e.g., above 3.0V is applied between adjacent second wirings 71.

Here, structures of the multilayer wiring structures and manufacturing conditions of the semiconductor device 1 to enhance the controllability of processing the wiring of the semiconductor device and the dielectric strength voltage between wirings will be described.

Figure 4:
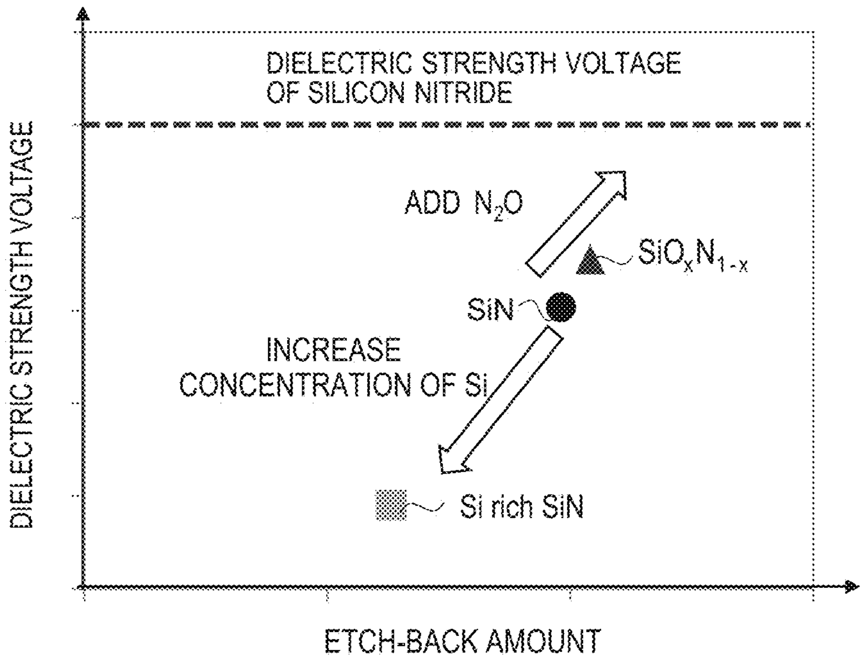
FIG. 4 is an explanatory diagram illustrating a relationship between etch-back amount of silicon nitride and silicon oxynitride and dielectric strength.

FIG. 4 is an explanatory diagram that illustrates a relationship between etch-back amount of silicon nitride and silicon oxynitride and dielectric strength.

For instance, as shown in FIG. 4, an etching amount of the silicon oxynitride film ($SiO_xN_{1-x}$ film) applied on the second insulating film 48 that functions as the stopper film of the semiconductor device 1 of the present embodiment, is greater (i.e., selectivity decreases) when compared with a SiN film used as a stopper film for conventional dry etching (especially RIE). On the other hand, the dielectric strength of the silicon oxynitride film ($SiO_xN_{1-x}$ film) increases (approaches the dielectric strength of the silicon oxide). As will be described below, the oxygen ratio x ($0<x<1$) in the silicon oxynitride film ($SiO_xN_{1-x}$ film), for example, may be adjusted by controlling the ratio of $N_2O$ added to the source gas of the plasma CVD used to form the silicon oxynitride film.

Also, as shown in FIG. 4, when the concentration of Si in the SiN film is increased, there is a trend where the etch-back amount of the SiN film decreases (i.e., selectivity increases (approaches the selectivity of a-Si)) but the dielectric strength voltage of the SiN film decreases.

As such, it is thought to be possible to form the second insulating film 48 of the semiconductor device 1 as the stopper film having the selectivity and dielectric strength within target range, by controlling the ratio of $N_2O$ added to the source gas of the plasma CVD used to form e.g., the silicon oxynitride film. Next, FIG. 5 is an explanatory diagram illustrating the oxygen ratio to nitrogen in silicon oxynitride and a relationship between the selectivity for silicon oxide and dielectric strength.

For example, silane ($SiH_4$), ammonia ($NH_3$), and nitrogen dioxide ($N_2O$) may be supplied as the source gas to form the second insulating film 49 (silicon oxynitride film) in the abovementioned plasma CVD. When the ratio of nitrogen dioxide ($N_2O$) to the entire source gas of silane ($SiH_4$), ammonia ($NH_3$), and nitrogen dioxide ($N_2O$), i.e., $N_2O/(SiH_4+NH_3+N_2O)$ changes, the ratio of nitrogen forming the silicon oxynitride film changes. The condition of plasma CVD used to form the $SiO_xN_{1-x}$ applied on the second insulating film 48 may be e.g., pressure in range 2 Torr (266.64 Pa) to 10 Torr (1333.2 Pa) and temperature in range 300° C. to 400° ° C. Also, the line width L of the second wiring 71 and the distance S between adjacent second wirings 71 may be set to in a range of 10 nm or more and 50 nm or less.

Figure 5:
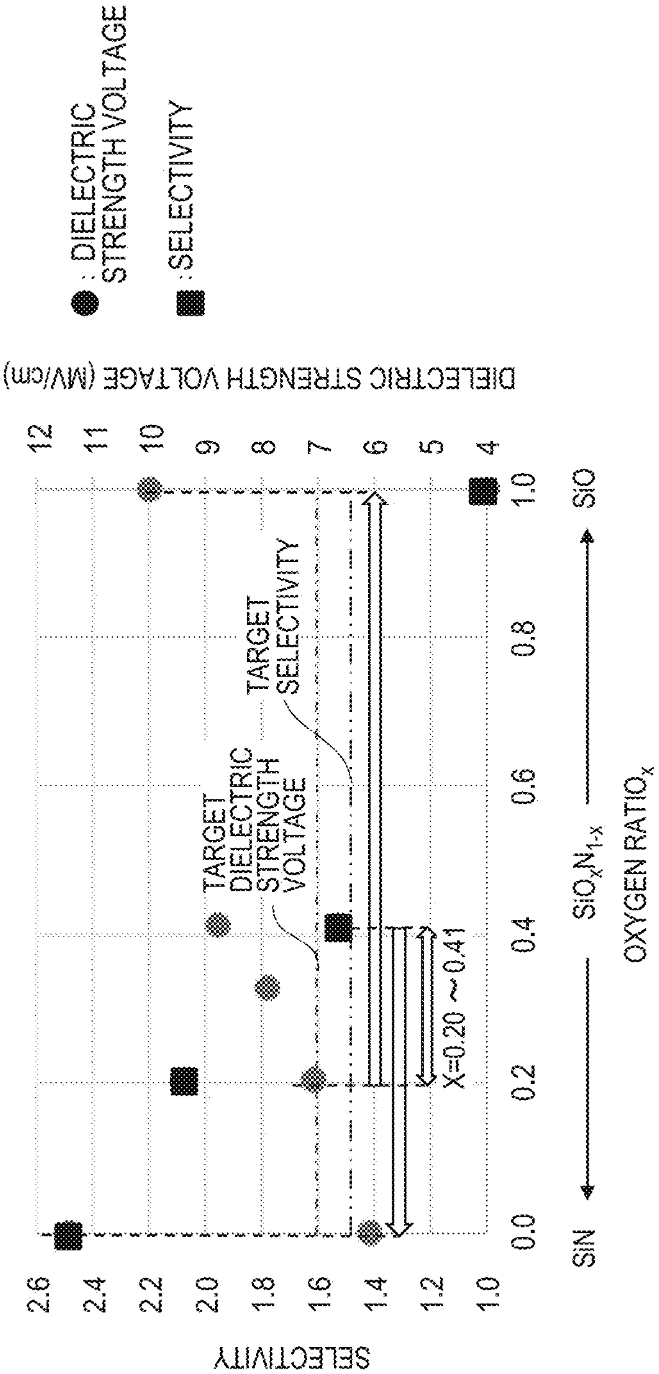
FIG. 5 is an explanatory diagram illustrating an oxygen ratio to nitrogen in silicon oxynitride, and a relationship between a selectivity for silicon oxide and dielectric strength.

For example, as shown in FIG. 5, when the oxygen ratio x in $SiO_xN_{1-x}$ is changed from 0.0 to 1.0, the selectivity of silicon oxynitride to silicon oxide in dry etching becomes greater than the target selectivity when the oxygen ratio x is below 0.41. On the other hand, for example, as shown in FIG. 5, the dielectric strength voltage of the silicon nitride becomes greater than the target dielectric strength voltage when the oxygen ratio x is above 0.20. By controlling the ratio of $N_2O$ added to the source gas of the plasma CVD used to form the silicon oxynitride film e.g., in range 6.9% to 30.9%, the oxygen ratio x in the formed $SiO_xN_{1-x}$ may be controlled between 0.21 to 0.41.

As such, by controlling the ratio of $N_2O$ added to the source gas of the plasma CVD used to form the silicon oxynitride film and controlling the oxygen ratio x in the formed $SiO_xN_{1-x}$ in the predetermined range, it is envisaged that the second insulating film 48 of the semiconductor device 1 may be formed as the stopper film having the selectivity and dielectric strength voltage within target range (FIG. 5).

Accordingly, by applying silicon oxynitride to the second insulating film 49 that functions as the stopper film in the damascene structure of the semiconductor device 1 and adequately controlling the ratio of $N_2O$ added to the source gas of the plasma CVD used to form the silicon oxynitride film, it becomes possible to achieve both the selection rate and the dielectric strength voltage of the second insulating film 49 to function as the stopper film within target range.

As such, the second insulating film 48 in the damascene structure of the semiconductor device 1 may be set to include silicon oxynitride and have properties where the processing selectivity (dry etching using RIE) is greater than that of the first insulating film 47 and the third insulating film 49 and where the dielectric strength is greater than that of silicon nitride. Accordingly, the dielectric strength between adjacent second wirings 71 may be set to 7 MV/cm or more.

Further, as described above, when the line width L of the second wiring 71 and the distance S between adjacent second wirings 71 are set between e.g., in a range of 10 nm or more and 50 nm or less, and when the semiconductor device 1 operates under conditions where voltage below e.g., 3.0V is applied between adjacent second wirings 71, it is thought that a yield will be enhanced since the dielectric strength between adjacent second wirings 71 set to 7 MV/cm or more suppresses an operation failure of the semiconductor device 1 due to dielectric breakdown.

In other words, the semiconductor device 1 may enhance the controllability of processing the wiring and the dielectric strength between the wirings.

[Manufacturing Method of the Semiconductor Device]

Next, as described, the method of manufacturing of the semiconductor device 1 according to the first embodiment will be described with reference to FIGS. 6 to 9. FIGS. 6 to 9 are explanatory diagrams illustrating a manufacturing process for the semiconductor device 1 according to the first embodiment shown in FIGS. 1 and 2. FIGS. 6 to 9 specifically focus on the manufacturing process of the first connection wiring layer 32 of the semiconductor device 1 according to the first embodiment shown in FIG. 3A. The method of manufacturing of the first connection wiring 32 of the semiconductor device 1 according to the first embodiment shown in FIG. 3B will also be described in a similar way.

Figure 6A:
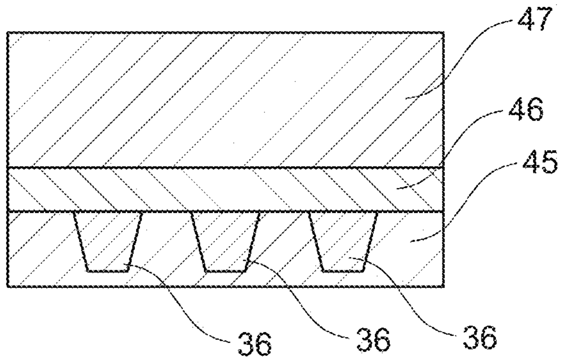
FIGS. 6A and 6B are explanatory diagrams illustrating a manufacturing process for the semiconductor device according to the first embodiment.

For example, after forming the device layer 31 (refer to FIGS. 1 and 2), as shown in FIG. 6A, the oxide film (silicon oxide layer) 45 is formed on the device layer 31 using e.g., CVD. Then the wiring 36 is formed on a back surface of the silicon oxide layer 45 using a damascene process.

Thereafter, the SiCN film 46 that functions as the cap film and the first insulating film (silicon oxide film) 47 are deposited in order (FIG. 6A) on the insulating layer (silicon oxide layer) 45 where the wiring is embedded using e.g., CVD.

Figure 6B:
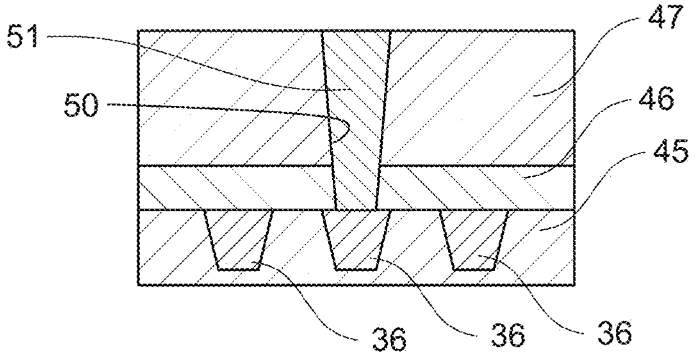

Next, as shown in FIG. 6B, the first groove 50 with a shape matching that of the first wiring 51 is formed at the location of the first wiring 51. In this process, a resist (not shown) is formed on the first insulating film (silicon oxide film) 47, and an opening is formed at the location of the first wiring (above the wiring 36 to be connected) 51 on the resist.

The resist with the opening is then used as a mask to selectively etch the first insulating film 47 and the cap film 46 using dry etching, e.g., reactive ion etching (RIE), and the first groove (via hole) 50 is formed on the first insulating film 47 and the cap film 46, reaching from the surface of the first insulating film 47 to the surface of the wiring 36.

Next, the barrier metal film (not shown) is formed on an inner surface of the first groove 50 and the surface of the first wiring 51 using e.g., spattering. Then, the second wiring 71 connected to the first wiring 51 is formed (FIG. 3A) by forming the conductive layer formed with e.g., tungsten in the second groove 70 via the barrier metal film using e.g., spattering. The first wiring 51 may be formed in the first groove 50 using e.g., electrolytic plating or other film formation methods.

Figure 7A:
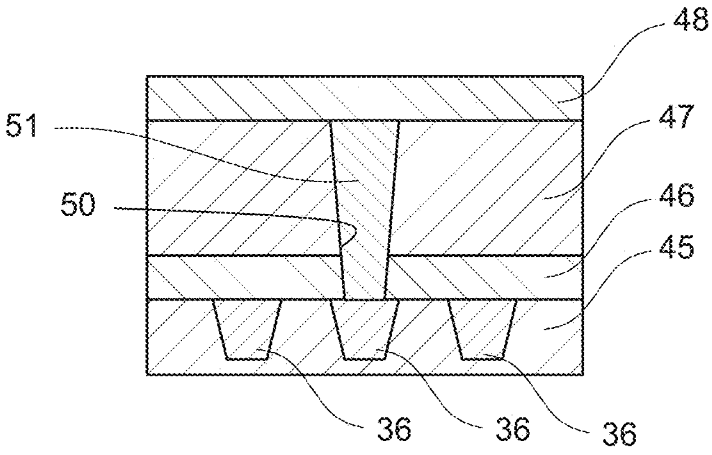
FIGS. 7A and 7B are explanatory diagrams illustrating the manufacturing process for the semiconductor device according to the first embodiment.
Figure 7B:
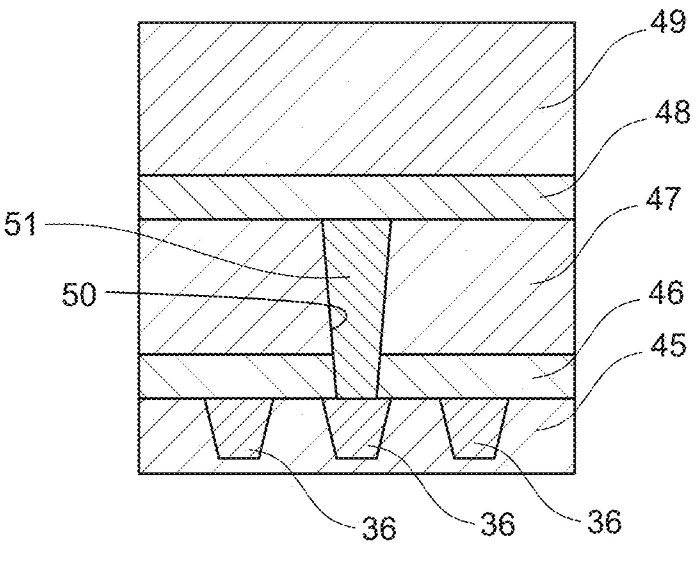

Next, as shown in FIG. 7A, the second insulating film 48 is formed on the first insulating film 47 using e.g., plasma CVD.

As described, the oxygen ratio x in the formed $SiO_xN_{1-x}$ may be controlled between 0.21 to 0.41 by controlling the ratio of $N_2O$ added to the source gas of the plasma CVD used to form the silicon nitride film applied to the second insulation film 48 in the range of e.g., 6.9% to 30.9%. This allows forming the second insulating film 48 of the semiconductor device 1 as the stopper film having the selectivity and dielectric strength (FIG. 5) within target range, by controlling the ratio of $N_2O$ added to the source gas of the plasma CVD used to form the silicon oxynitride film and controlling the oxygen ratio x in the formed $SiO_xN_{1-x}$.

Next, as shown in FIG. 7A, the third insulating firm (silicon oxide film) 49 is formed on the second insulating film 48 using e.g., CVD.

Figure 8A:
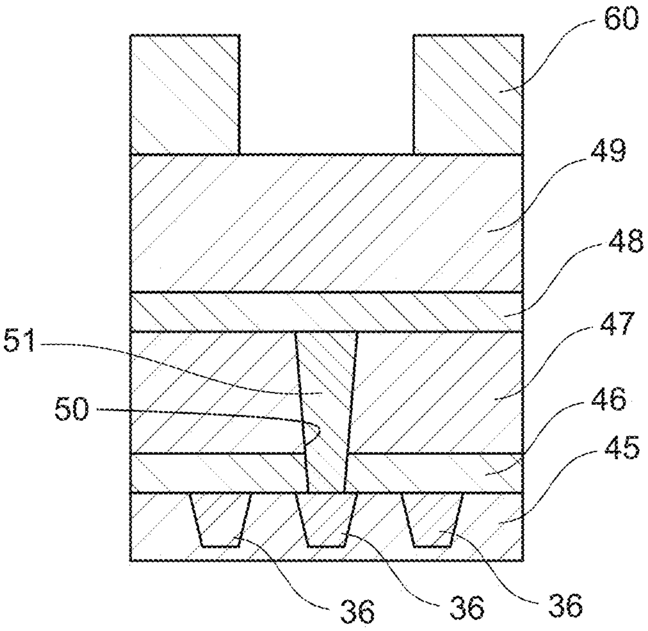
FIGS. 8A and 8B are explanatory diagrams illustrating the manufacturing process for the semiconductor device according to the first embodiment.

Next, as shown in FIG. 8A, the second groove 70 with a shape matching that of the second wiring 71 is formed at the location of the second wiring 71 (refer to FIG. 3A). In this process, a resist 60 is formed on the third insulating film (silicon oxide film) 49, and an opening is formed at the location of the second wiring (above the first wiring 51 to be connected) 71 on the resist.

Figure 8B:
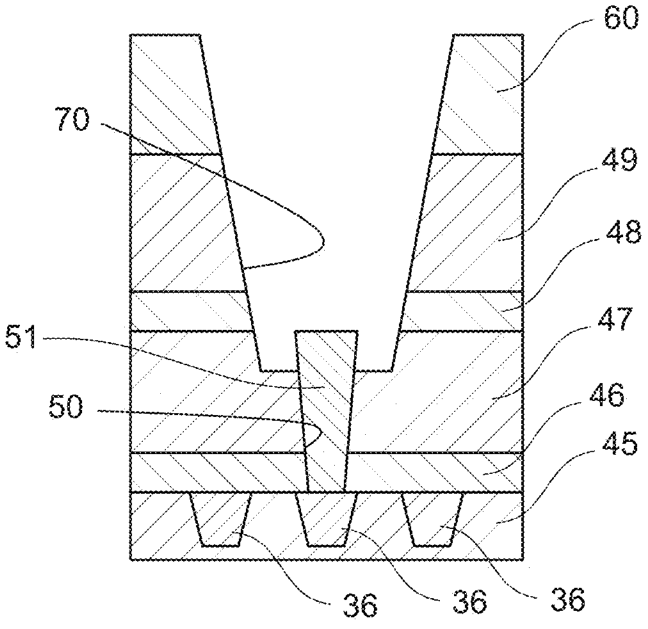

Next, as shown in FIG. 8B, the resist 60 with the opening is then used as the mask to selectively etch the first insulating film 47 and the second insulating film 48 using dry etching, e.g., RIE, and the second groove 70 is provided in communication with the first insulating film 47, the second insulating film 48, and the third insulating film 49, reaching from the surface of the second insulating film 49 to the surface of the wiring 36.

As described, the second insulating film 48 has properties to function as the stopper film for dry etching, where the processing selectivity is higher than that of the first insulating film (silicon oxide film) 47 and the third insulating film (silicon oxide film) 49 and the dielectric strength is higher than that of silicon nitride.

Accordingly, the second insulation film 48 functions as the stopper film for dry etching and may enhance the controllability of forming the second groove 70 (i.e., controllability of an etching amount of the first insulating film 40). Further, the oxygen ratio of the second insulating film 48 is set to have properties where the dielectric strength voltage is higher than that of the silicon nitride (SiN) film that functions as conventional so-called stopper films.

As a result, the yield may be enhanced by reducing a defect rate of the semiconductor device 1.

Figure 9A:
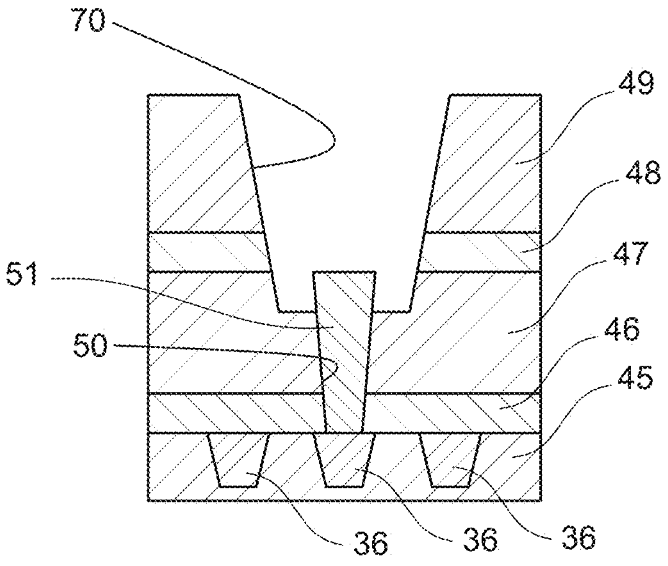
FIGS. 9A and 9B are explanatory diagrams illustrating the manufacturing process for the semiconductor device according to the first embodiment.
Figure 9B:
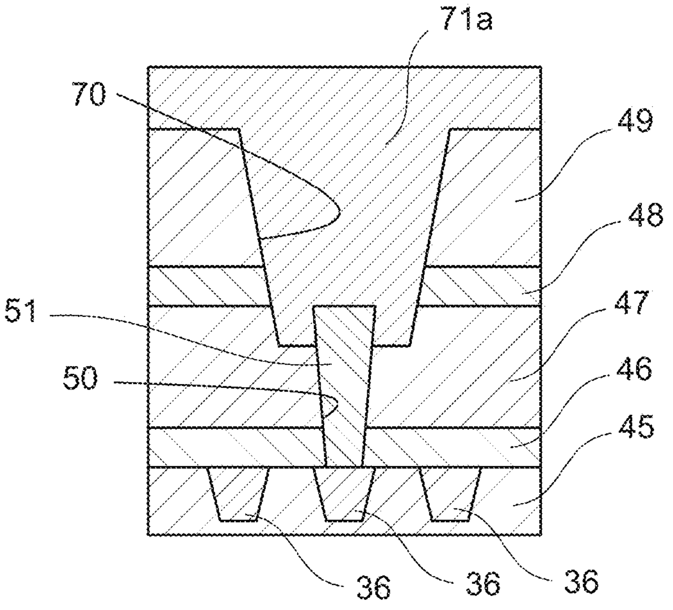

Next, as shown in FIG. 9A, the resist 60 left on the second insulating film 49 is removed by ashing.

Next, the barrier metal film (not shown) is formed on an inner surface of the second groove 70 and the surface of the first wiring 51 using, e.g., spattering. Then, a conductive film 71*a* is formed (FIG. 9B) with e.g., tungsten in the second groove 70 via the barrier metal film using e.g., spattering. The conductive film 71*a* may be formed in the second groove 50 using e.g., electrolytic plating or other film formation methods.

Next, an upper part of the second insulating film 49 and the conductive film 71*a* is flattened by polishing unnecessary parts in the upper portion of the second insulating film 49 and the conductive film 71*a* using e.g., chemical mechanical polishing (CMP). This forms the second wiring 71 connected to the first wiring 51, which forms the multilayer wiring structure of the semiconductor device 1 according to the first embodiment as shown in FIG. 3A or 3B. The wirings, electrodes, and insulation layers may be further formed as necessary.

As described above, the semiconductor device 1 according to the present embodiment includes the first insulating film 47, the second insulating film 48 provided on the first insulating film 47, the third insulating film 49 provided on the second insulating film 48, the first wiring 51 provided in the first groove 50 formed in the first insulating film 47, and the second wiring 71 connected to the first wiring 51 and provided in the second groove 70 provided in communication with the first insulating film 47, the second insulating film 48, and the third insulating film 49.

Also, as described, the second insulating film 48 includes silicon oxynitride. In order to function as the etching stopper film, the second insulating film 48 properties where the processing selectivity (dry etching using RIE) is greater than that of the first insulating film 47 and the third insulating film 49 and where the dielectric strength voltage is greater than that of silicon nitride.

In particular, as described, by applying silicon oxynitride to the second insulating film 49 that functions as the stopper film in the damascene structure of the semiconductor device 1 and adequately controlling the ratio of $N_2O$ added to the source gas of the plasma CVD used to form the silicon oxynitride film, it becomes possible to achieve both the selection rate and the dielectric strength of the second insulating film 49 to function as the stopper film within target range.

As such, the second insulating film 48 in the damascene structure of the semiconductor device 1 may be set to include silicon oxynitride and have properties where the processing selectivity (dry etching using RIE) is greater than that of the first insulating film 47 and the third insulating film 49 and where the dielectric strength is greater than that of silicon nitride. Accordingly, the dielectric strength between adjacent second wirings 71 may be set to 7 MV/cm or more.

Further, when the line width L of the second wiring 71 and the distance S between adjacent second wirings 71 (L/S) are set in a range of 10 nm or more and 50 nm or less, and when the semiconductor device 1 operates under conditions where voltage below e.g., 3.0V is applied between the adjacent second wirings 71, it is thought that a yield will be enhanced since the dielectric strength between adjacent second wirings 71 set to 7 MV/cm or more suppresses the operation failure of the semiconductor device 1 due to dielectric breakdown.

As described above, the semiconductor device according to the present embodiment allows enhancing the controllability of processing the wiring and the dielectric strength between the wirings.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:

a first insulating film;

a second insulating film provided on the first insulating film;

a third insulating film provided on the second insulating film;

a first wiring provided in a first groove provided in the first insulating film; and a second wiring provided in a second groove provided in communication with the first insulating film, the second insulating film, and the third insulating film and connected to the first wiring, wherein the second insulating film contains silicon oxynitride, the second insulating film has a processing selectivity higher than processing selectivity of the first insulating film and the third insulating film, and the second insulating film has a dielectric strength voltage higher than a dielectric strength voltage of silicon nitride, and wherein the first wiring is provided in the first groove provided in communication with the first insulating film and a fourth insulating film, the fourth insulating film provided below the first insulating film.

2. The semiconductor device according to claim 1, wherein the first insulating film is a $SiO_2$ film, the second insulating film is a $SiO_xN_{1-x}$ film, the third insulating film is a $SiO_2$ film, and x of the $SiO_xN_{1-x}$ film is a value in a range of 0.2 or more and 0.41 or less.

3. The semiconductor device according to claim 2, wherein a line width of the second wiring and an interval between adjacent second wirings are in a range of 10 nm or more and 50 nm or less.

4. The semiconductor device according to claim 2, wherein the dielectric strength voltage between the adjacent second wirings is 7 MV/cm or more.

5. The semiconductor device according to claim 3, wherein the dielectric strength voltage between the adjacent second wirings is 7 MV/cm or more.

6. A method of manufacturing a semiconductor device comprising:

forming a fourth insulating film;

forming a first insulating film provided on the fourth insulating film;

forming a first groove in communication with the first insulating film and the fourth insulating film, by selectively etching the first insulating film and the fourth insulating film;

forming a first wiring provided in the first groove;

forming a second insulating film provided on the first insulating film;

forming a third insulating film provided on the second insulating film;

forming a second groove provided in communication with the first insulating film, the second insulating film, and the third insulating film and connected to the first wiring, by selectively etching the first insulating film, the second insulating film, and the third insulating film; and forming a second wiring provided in the second groove, wherein the second insulating film contains silicon oxynitride, the second insulating film has a processing selectivity higher than processing selectivity of the first insulating film and the third insulating film, and the second insulating film has a dielectric strength voltage higher than a dielectric strength voltage of silicon nitride.

7. The method of manufacturing the semiconductor device according to claim 6, wherein the first insulating film is a $SiO_2$ film, the second insulating film is a $SiO_xN_{1-x}$ film, the third insulating film is a $SiO_2$ film, and x of the $SiO_xN_{1-x}$ film is a value in a range of 0.2 or more and 0.41 or less.

8. The method of manufacturing the semiconductor device according to claim 7, wherein a line width of the second wiring and an interval between adjacent second wirings are in a range of 10 nm or more and 50 nm or less.

9. The method of manufacturing the semiconductor device according to claim 7, wherein the dielectric strength voltage between the adjacent second wirings is 7 MV/cm or more.

10. The method of manufacturing the semiconductor device according to claim 8, wherein the dielectric strength voltage between the adjacent second wirings is 7 MV/cm or more.

11. The semiconductor device according to claim 1, wherein one end of the first wiring is connected to the second wiring, and the other end of the first wiring is connected to a third wiring in a fifth insulating film, the fifth insulating film is provided below the fourth insulating film.

12. The semiconductor device according to claim 1, wherein a line width of the second wiring is greater than a line width of the first wiring.

13. The semiconductor device according to claim 11, wherein the second wiring covers the one end of the first wiring.

14. The method of manufacturing the semiconductor device according to claim 6, further comprising:

before forming the fourth insulating film, forming a fifth insulating film such that the fourth insulating film is to be formed on the fifth insulating film; and forming a third wiring in the fifth insulating film, wherein the step of forming the first wiring forms the first wiring in the first groove to penetrate the fourth insulating film until a bottom end thereof reaches the third wiring, and the step of forming the second wiring forms the second wiring in the second groove to bury a top end of the first wiring.

15. The method of manufacturing the semiconductor device according to claim 6, wherein a line width of the second wiring is greater than a line width of the first wiring.

16. The method of manufacturing the semiconductor device according to claim 14, wherein the second wiring covers the top end of the first wiring.

* * * * *